United States Patent [19]
Choi et al.

[11] Patent Number: 5,321,306
[45] Date of Patent: Jun. 14, 1994

[54] METHOD FOR MANUFACTURING A SEMICONDUCTOR DEVICE

[75] Inventors: Do-chan Choi; Kyung-tae Kim, both of Seoul, Rep. of Korea

[73] Assignee: Samsung Electronics Co., Ltd., Kyunggi, Rep. of Korea

[21] Appl. No.: 832,339

[22] Filed: Feb. 7, 1992

Related U.S. Application Data

[60] Division of Ser. No. 751,761, Aug. 29, 1991, Pat. No. 5,175,121, which is a continuation of Ser. No. 494,185, Mar. 15, 1990, Pat. No. 5,045,494.

Foreign Application Priority Data

May 10, 1989 [KR] Rep. of Korea ............... 89-6206

[51] Int. Cl.$^5$ ........................................... H01L 29/68
[52] U.S. Cl. ................................ 257/754; 257/306; 257/740; 257/751
[58] Field of Search ............... 357/23, 6, 59; 257/740, 257/751, 752, 754, 306

[56] References Cited

U.S. PATENT DOCUMENTS

| | | | |
|---|---|---|---|
| 4,521,794 | 6/1985 | Murase et al. | 357/59 |
| 4,725,877 | 2/1988 | Brasen et al. | 257/751 |
| 4,754,313 | 6/1988 | Takemae et al. | 357/23.6 |
| 5,073,810 | 12/1991 | Owada | 257/754 |

Primary Examiner—Edward Wojciechowicz
Attorney, Agent, or Firm—Cushman Darby & Cushman

[57] ABSTRACT

A method for manufacturing a semiconductor device includes forming contact holes in insulating layers to expose an impurity doped region of a semiconductor substrate. An epitaxial layer is then grown in the contact hole. A polycrystalline silicon layer is formed over the top to provide the lower electrode of a capacitor. Accordingly, the polycrystalline layer is separated from the impurity doped region thereby preventing current leakage.

6 Claims, 9 Drawing Sheets

METHOD FOR MANUFACTURING A SEMICONDUCTOR DEVICE

This is a division of application Ser. No. 07/751,761, filed Aug. 29, 1991 now U.S. Pat. No. 5,175,121 issued, Dec. 29, 1992 which is a continuation of application Ser. No. 07/494,185, filed Mar. 15, 1990 now U.S. Pat. No. 5,045,494 issued Sep. 3, 1991.

FIELD OF THE INVENTION

The present invention relates to a manufacturing method for a semiconductor device, and particularly to a manufacturing method for a semiconductor device having an epitaxial layer selectively grown on the contact portion of a semiconductor substrate to improve the reliability of the semiconductor device.

BACKGROUND AND RELATED ART

With the progress of microtechnology in the semiconductor manufacturing field, the physical dimensions of semiconductor devices are becoming increasingly smaller. As these devices become smaller, the contact area has been reduced to dimensions below 1 $\mu$m. However, due to the reduction of the contact area, contact resistance increases. Further, a step coverage defect may occur at the stepped portion due to a high aspect ratio, which is caused by microscale processing.

Meanwhile, since dynamic DRAM semiconductor devices are being manufactured in densities of mega-bit order, various capacitor structures have been proposed to obtain sufficient capacitances in a limited space. Particularly, in the semiconductor devices of a 4Mbit scale, a stacked capacitor (STC) structure is generally used because it is simple to manufacture and it has a high immunity against soft errors.

The conventional STC has a capacitor structure stacked on an access transistor which is formed on a semiconductor substrate. The capacitor consists of a storage node (i.e., a lower electrode), a dielectric film and an upper electrode. The storage node contacts the source (diffused or ion-implanted region) of the access transistor and usually is formed of polycrystalline silicon doped with an impurity.

However, the conventional STC has several drawbacks. First, the defects of the polycrystalline silicon are distributed over the source (doped region), which cause current leaks at the contact portion. Accordingly, the reliability of the semiconductor device is reduced. Further, the conventional STC has a structural characteristic wherein its capacitance decreases as its density increases. As a result, 4Mbit devices form a limit in conventional semiconductor manufacturing techniques.

Therefore, to manufacture a 16Mbit or a 64Mbit device, the limited space must be utilized more effectively. Accordingly, multi-layer structures, built in the upward direction above the substrate, or in the downward direction in a trench etched in the substrate, have been proposed to increase the effective total area of the capacitor. However, in the case where a multi-layer structure is formed in the upward direction, the contact hole of the drain (doped region) of the access transistor is deepened, thereby making it difficult to contact a bit line to the drain (diffused or ion-implanted region).

SUMMARY OF THE INVENTION

The present invention is intended to overcome the above described disadvantages of the conventional techniques.

Therefore, it is an object of the present invention to provide a method for manufacturing a semiconductor device which solves the problems arising from the increasingly reduced dimensions of the semiconductor contact portion.

It is another object of the present invention to provide a method for manufacturing a dynamic cell semiconductor device wherein electric current leakage from the contact portion between the access transistor and the capacitor is effectively eliminated.

In achieving the above objects, the method for manufacturing a semiconductor device according to the present invention includes selectively doping an impurity into the surface of a semiconductor substrate. An insulating layer is deposited and selectively etched to form a contact hole through which an area of the impurity-doped region is exposed. An epitaxial layer is then grown using the exposed surface of the impurity doped region as a seed. Finally, a conductive layer is deposited upon the epitaxial layer.

The conductive layer is made of a polycrystalline silicon formed upon the impurity doped region and is applicable to all contacting type semiconductor devices.

BRIEF DESCRIPTION OF THE DRAWINGS

The above objects and other advantages of the present invention will become more fully apparent by the following description of the preferred embodiment of the present invention with reference to the attached drawings in which.

DETAILED DESCRIPTION OF THE PREFERRED EMBODIMENT

Figure 1:
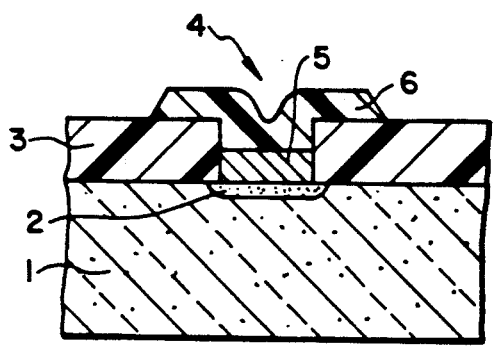
FIG. 1 is a sectional view of the semiconductor device according to the present invention.

FIG. 1 is a sectional view showing an embodiment of the semiconductor device according to the present invention. A diode (for example, a PN-coupled diode) is illustrated wherein a second conduction type (for example, N+ type) impurity-doped region 2 is coupled to a first conduction type (for example, P type) semiconductor substrate 1. An insulating layer 3 (for example, an $SiO_2$ layer) is formed on the semiconductor substrate 2, and contact hole 4 is formed therein in the impurity-doped region 2. An epitaxial layer 5 is provided within the contact hole 4 and a conductive layer 6 (i.e., a polycrystalline silicon layer) is formed upon the epitaxial layer 5.

In the above described structure, crystal defects of the conductive layer 6 are prevented from contacting the impurity-doped region 2 due to the epitaxial layer 5. Therefore, current leakage, as seen in conventional devices, is prevented.

Figure 2A:
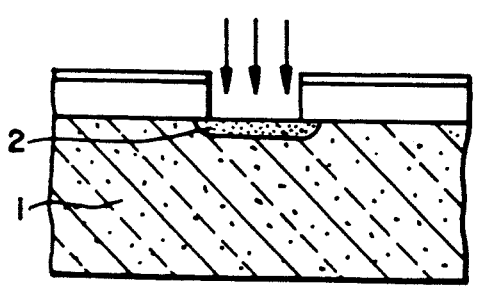
FIGS. 2A to 2D are sectional views showing the manufacturing process of the semiconductor device of FIG. 1.
Figure 2B:
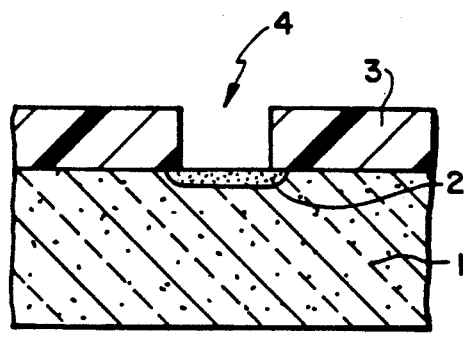

FIGS. 2A to 2D are sectional views showing the manufacturing process for the semiconductor device having the above described structure. In FIG. 2A, an N+ type impurity is selectively doped via a doping mask into a region 2 of the surface of a P type semiconductor substrate 1. After doping, the doping mask is removed and an insulating layer 3 is deposited on substrate 1 as illustrated in FIG. 2B. A contact hole 4 is then formed by selectively removing via a contact mask a part of the insulating layer 3 formed on the impurity-doped region 2.

Figure 2C:
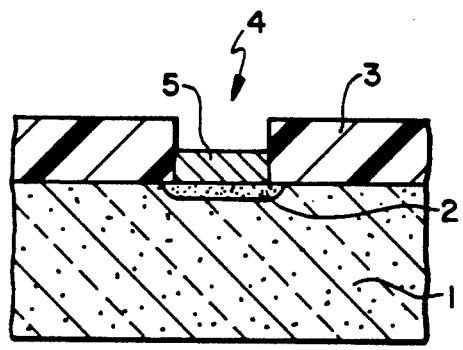

As shown in FIG. 2C, an epitaxial layer 5 is grown via a chemical vapor deposition method (CVD) using the surface of the exposed impurity doped region 2 as a seed.

Figure 2D:
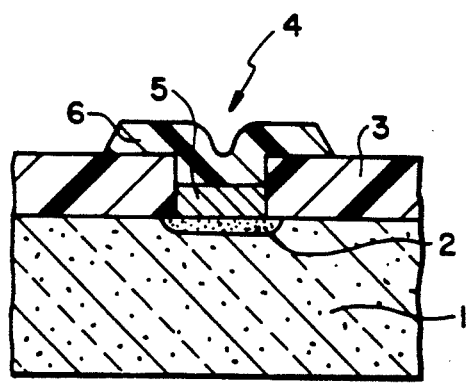

In FIG. 2D, a conductive layer 6 (e.g., a polycrystalline silicon layer) is formed and patterned above the epitaxial layer 5. The conductive layer 6 can be formed almost simultaneously with the epitaxial layer 5 by lowering the selection ratio.

The method of the present invention is preferably applicable to the manufacturing of a dynamic RAM. As the density of the dynamic RAM increases, the memory cell region is proportionally narrowed, and the contact area reduced. In conventional devices, the contact hole has a deep depth and a narrow cross sectional area, contributing to the problems discussed above.

However, according to the method of the present invention, the epitaxial layer is grown from the interior of the contact hole. As a result, contact failure is eliminated and the height of the step of the contact portion is considerably reduced, thereby improving the reliability and the manufacturing yield of the dynamic RAM. Further, given the improvements of the present invention, the contact size is reduced.

Several different embodiments of the manufacturing method for several modified capacitor structures of the dynamic RAM will now be described with reference to FIGS. 3 to 6.

Example I

FIGS. 3A to 3I are sectional views showing a method for manufacturing a stacked capacitor type dynamic RAM semiconductor device according to the present invention.

Figure 3A:
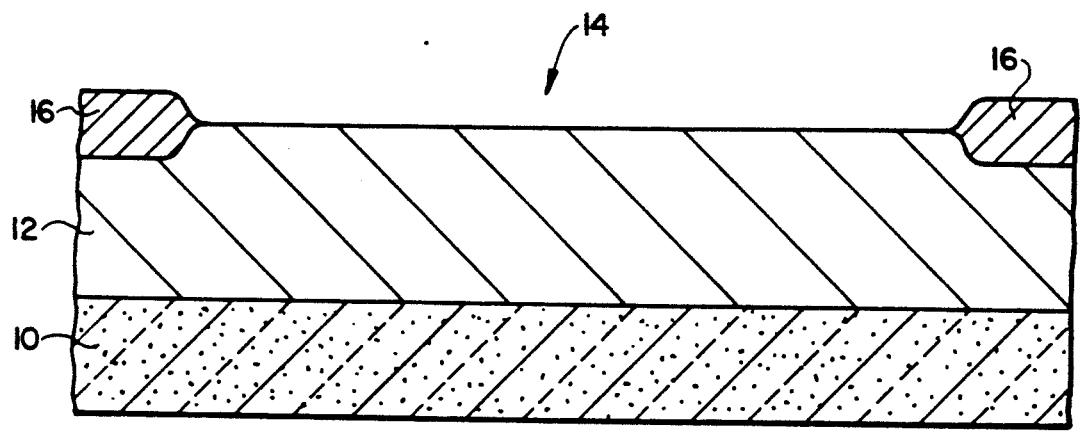
FIGS. 3A to 3I are sectional views showing the manufacturing process of the stacked capacitor type dynamic RAM semiconductor device according to the present invention.

As shown in FIG. 3A, a P type well 12 is formed on a semiconductor substrate 10. A field oxide layer 16 is formed according to the LOCOS (local oxidation of silicon) method to define an active region 14. Although not shown, a P+ channel stopper layer may also be formed under the field oxide layer 16.

Figure 3B:
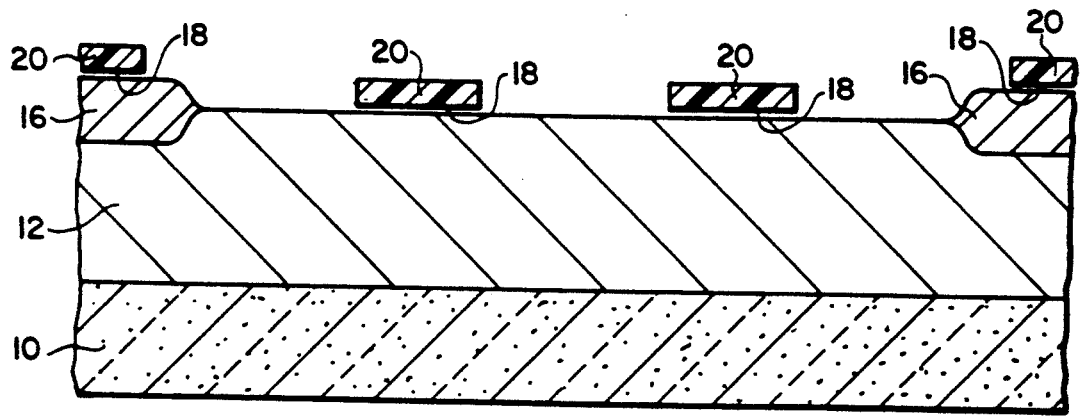

In FIG. 3B, a gate oxide layer 18 is provided, followed by a depositing of a first conductive layer 20 of polycrystalline silicon. The first conductive layer 20 is deposited in a pattern to define a gate electrode of the access transistor or a word line. In this FIGURE, the first conductive layer 20 formed upon the field oxide layer 16 is a word line connected to the gate electrode disposed between the adjacent cells.

Figure 3C:
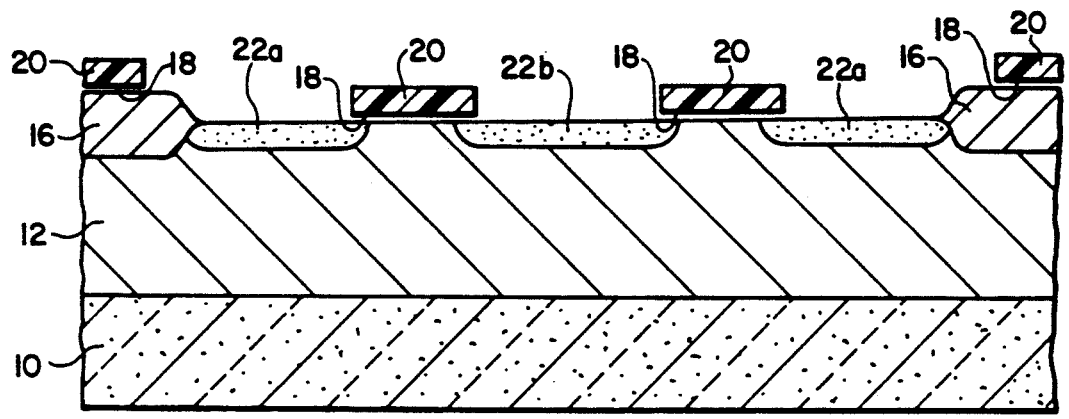

As illustrated in FIG. 3C, source and drain regions 22a, 22b of the access transistor are formed by doping the active region 14 of well 12 with an N+ type impurity according to ion implantation or diffusion methods. The field oxide layer 16 and the pattern of the first conductive layer 20 are employed as a mask to help define these regions 22a, 22b.

Figure 3D:
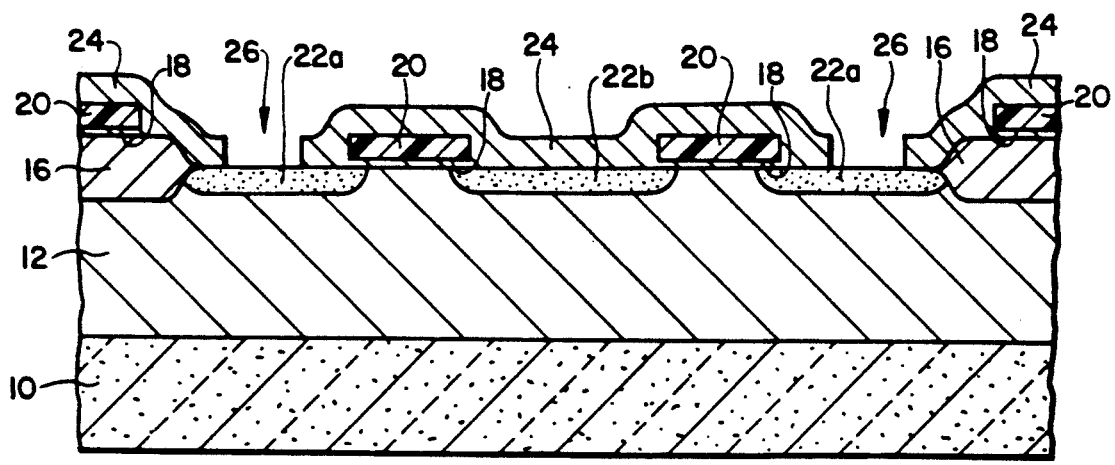

In FIG. 3D, a first insulating layer 24 is formed via the CVD process. The first insulating layer 24 is then selectively etched on the source region 22a, thereby forming a first contact hole 26 (i.e., a buried contact hole).

Figure 3E:
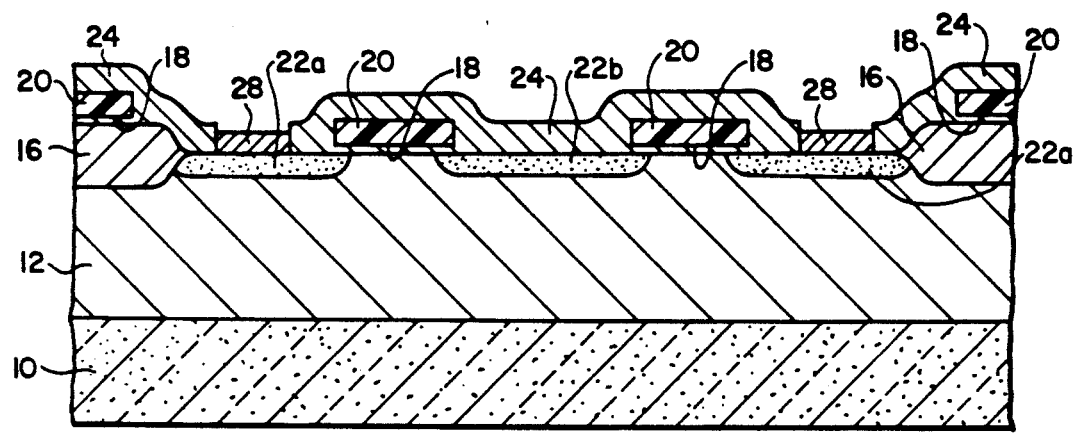

As shown in FIG. 3E, an epitaxial layer 28 is grown through the first contact hole 26 using the substrate surface of the source region 22a as a seed.

Figure 3F:
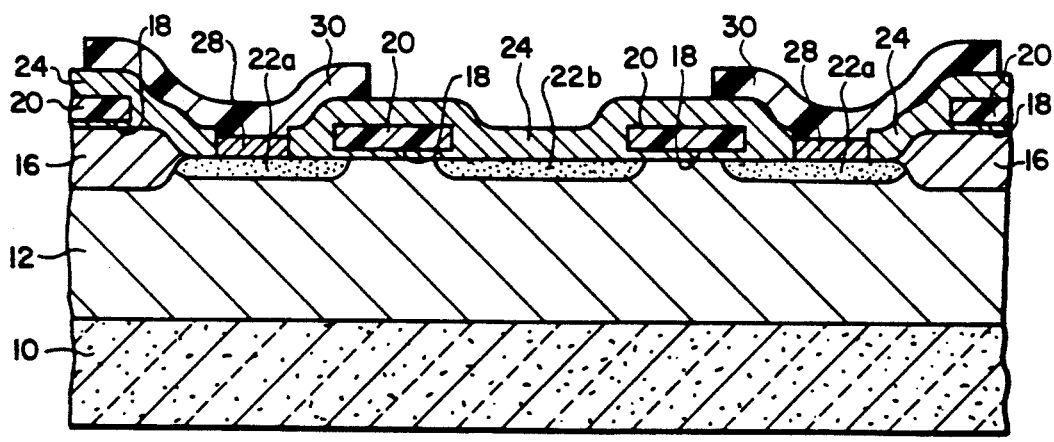

In FIG. 3F, a second conductive layer 30 (i.e., a polycrystalline silicon layer) is formed upon the whole surface of the epitaxial layer 28 and the first insulating layer 24. The second conductive layer 30 is doped with an N+ type impurity and then patterned as the lower electrode of the cell capacitor through the use of a photo-etching process.

Figure 3G:
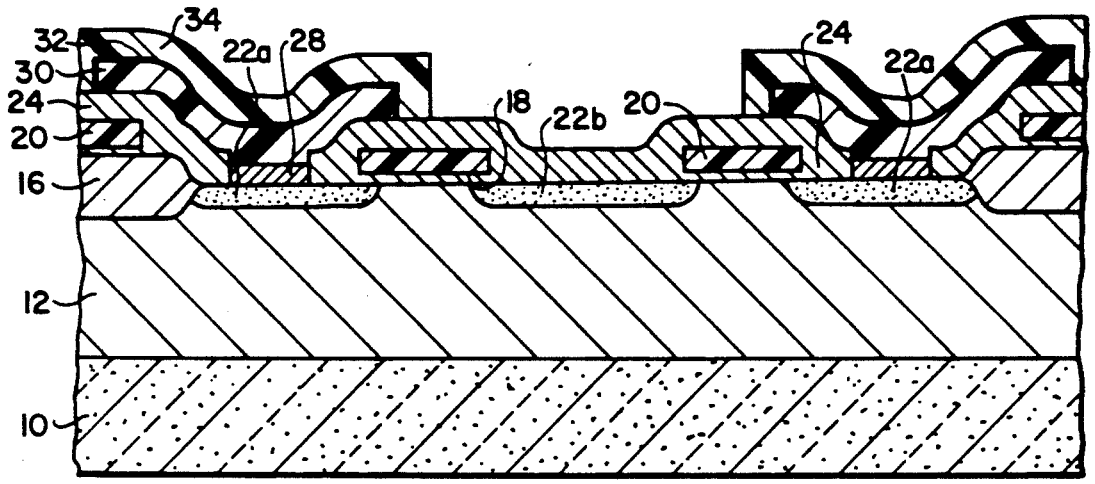

As illustrated in FIG. 3G, a dielectric layer 32 (i.e., ONO layer (oxide layer/nitride layer/oxide layer)) is formed on the whole surface of the second conductive layer 30 and the first insulating layer 24. A third conductive layer 34, (i.e., a polycrystalline silicon layer) is formed upon the dielectric layer 32 and then doped with an N+ type impurity via an ion implanting process or a POCL doping process. The dielectric layer 32 and the third conductive layer 34 are simultaneously etched to the illustrated pattern through the use of a photo-etching process. The third conductive layer 34 defines the upper electrode of the cell capacitor.

Figure 3H:
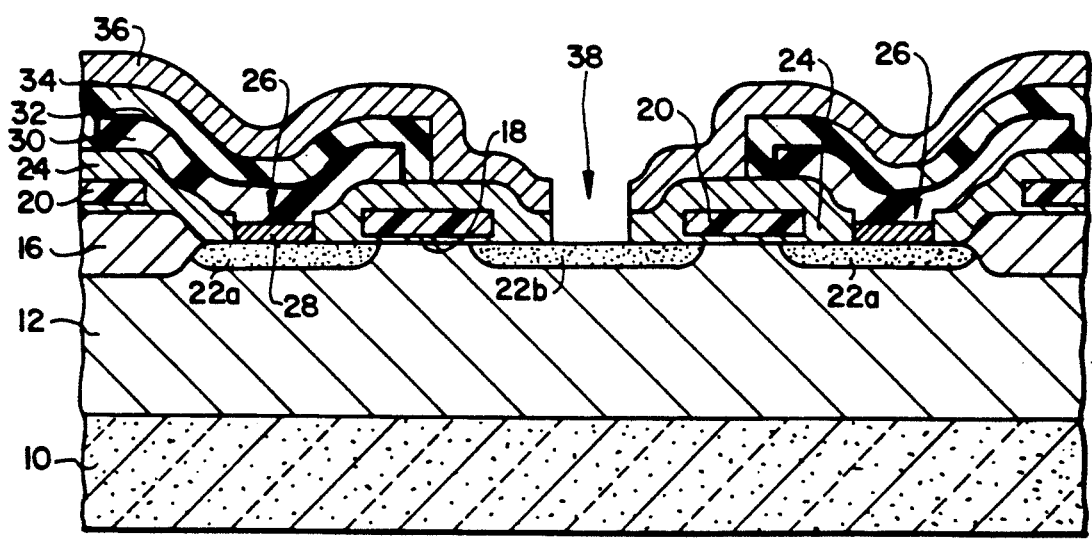

In FIG. 3H, a second insulating layer 36 (i.e., an oxide layer) is formed by a CVD process. The first and second insulating layers 24, 36 formed upon the drain region 22b are selectively etched to form a second contact hole 38 (i.e., a direct contact hole).

Figure 3I:
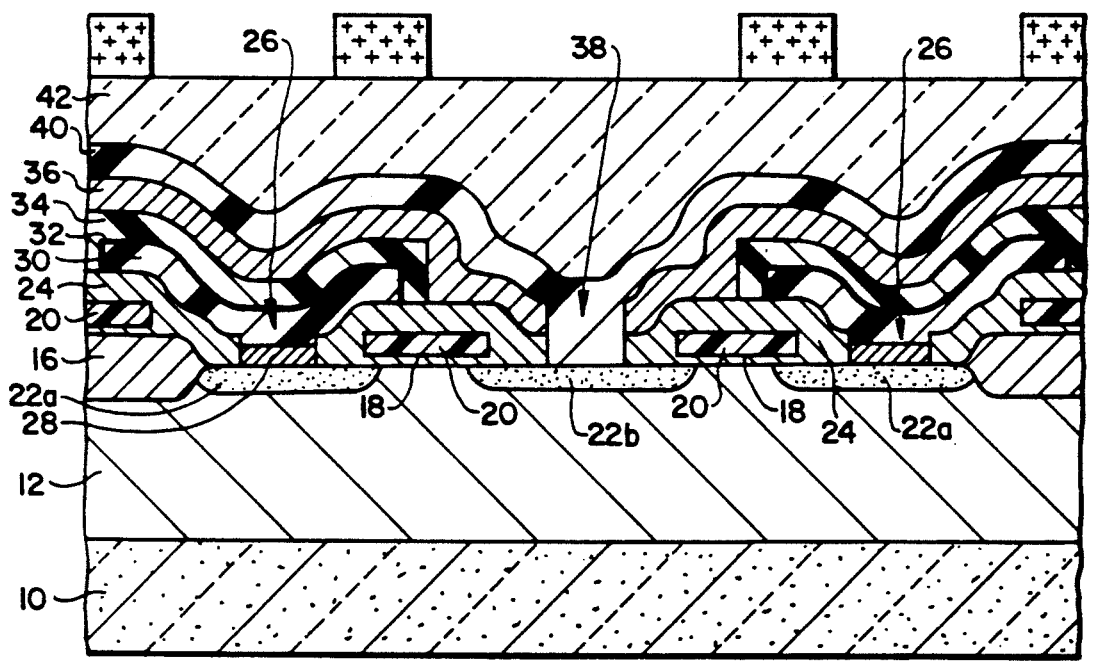

In FIG. 3I, a fourth conductive layer 40 (i.e., a polycrystalline silicon layer) is deposited on the whole face immediately following the formation of the contact hole, and doped with an N+ type impurity. The fourth conductive layer 40 is patterned in bit lines. Thereafter, a flattening layer 42 (e.g., a BPSG (borophosphorosilica glass) layer) is deposited.

Example II

Figure 4A:
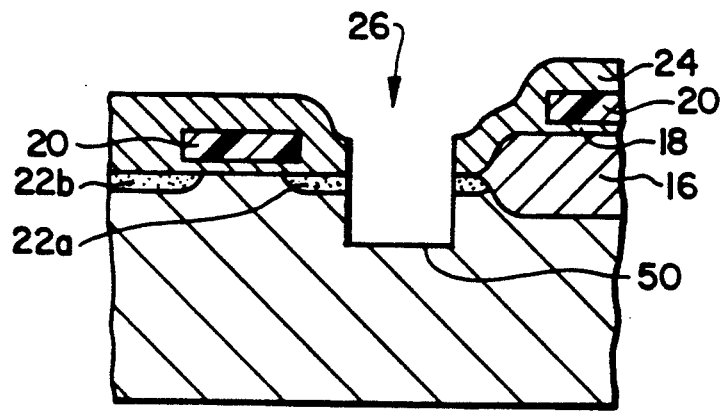
FIGS. 4A to 4C are sectional views showing a part of the manufacturing method for the combined stack-trench capacitor-type dynamic RAM semiconductor device according to a preferred embodiment of the present invention.
Figure 4B:
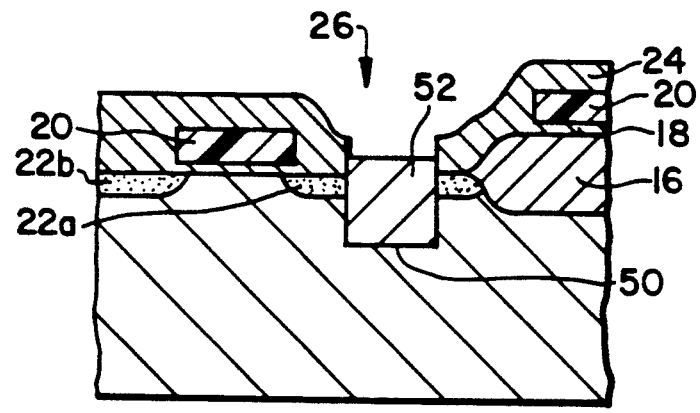
Figure 4C:
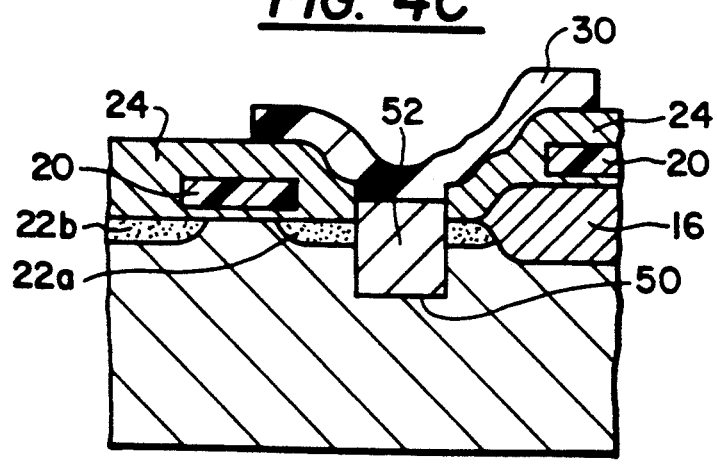

FIGS. 4A to 4C are sectional views showing a method for manufacturing the stack-trench combination capacitor type dynamic RAM semiconductor device according to the present invention. The descriptions of the steps identical to those of Example I are omitted.

In FIG. 4A, the substrate is etched through the first contact hole 26 to a depth of several hundred nm to several μm to form a trench 50. This etching step occurs after the formation of the first contact hole 26 described in FIG. 3D.

As shown in FIG. 4B, an epitaxial layer 52 is grown down into the contact hole 26, using the semiconductor substrate of the interior of the trench 50 as a seed. Accordingly, a pattern of a lower electrode of the capacitor (i.e., second conductive layer 30) is obtained as shown in FIG. 4C.

Example III

FIGS. 5A to 5D are sectional views showing a part of the manufacturing method for a modified stacked capacitor type dynamic RAM semiconductor device according to the present invention. Again duplicative steps illustrated in Example I are omitted.

Figure 5A:
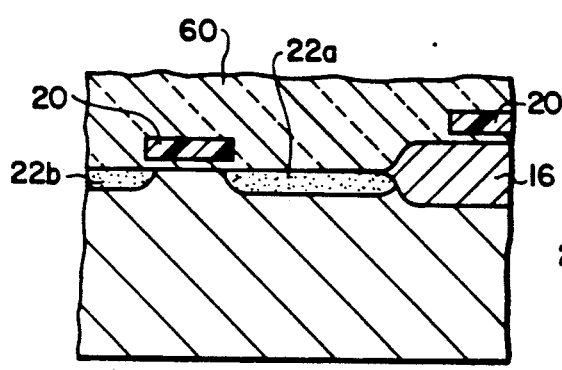
FIGS. 5A to 5D are sectional views showing a part of the manufacturing process for a modified stacked capacitor type dynamic RAM semiconductor device according to the present invention.

In FIG. 5A, a thick first insulating layer 60 (i.e., a BPSG layer) is formed after the formation of the first conductive layer 20 as illustrated in FIG. 3B.

Figure 5B:
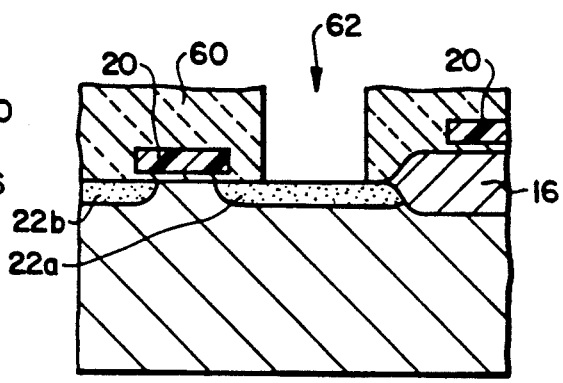

A first contact hole 62 is selectively etched in the flattened first insulating layer 60 in the source region 22a as shown in FIG. 5B.

Figure 5C:
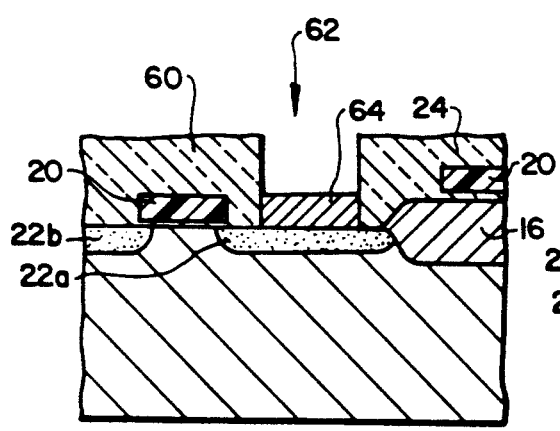

In FIG. 5C, an epitaxial layer 64 is grown using the substrate surface of the exposed source region 22a as a seed.

Figure 5D:
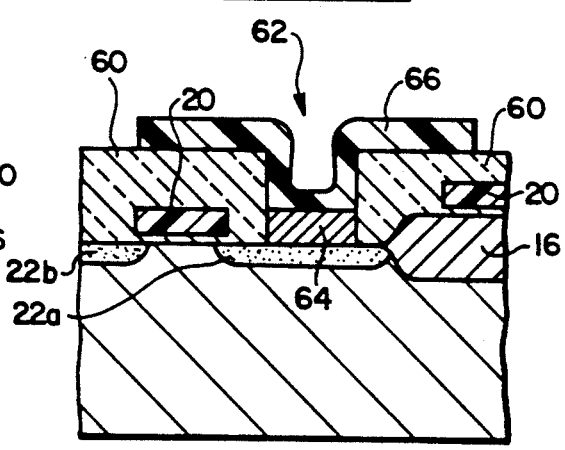

According to this embodiment in Example III, since the first contact hole 62 is formed by thickly flattening the first insulating layer 60, a second conductive layer 66 of a depressed capacitor has a lower electrode pattern as shown in FIG. 5D. The total area of the cell capacitor is expanded through the utilization of the first contact hole 62, thereby obtaining a sufficient cell capacitance.

Example IV

FIGS. 6A to 6D are sectional views showing a part of the method for manufacturing a modified stacked capacitor the dynamic RAM semiconductor device according to the present invention. Duplicative steps are omitted.

Figure 6A:
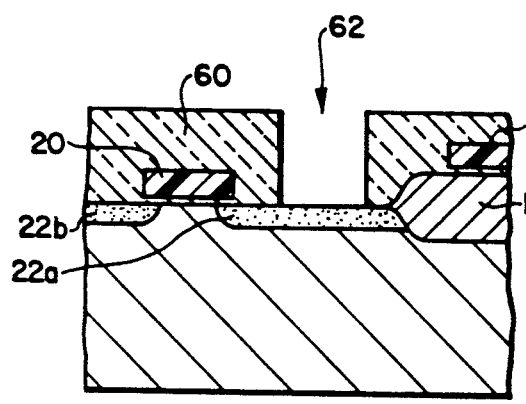
FIGS. 6A to 6D are sectional views showing a part of the manufacturing process for another modified stacked capacitor type dynamic RAM semiconductor device.

In FIG. 6A, a first contact hole 62 is selectively etched in the flattened first insulating layer 60 formed upon the source region 22a.

Figure 6B:
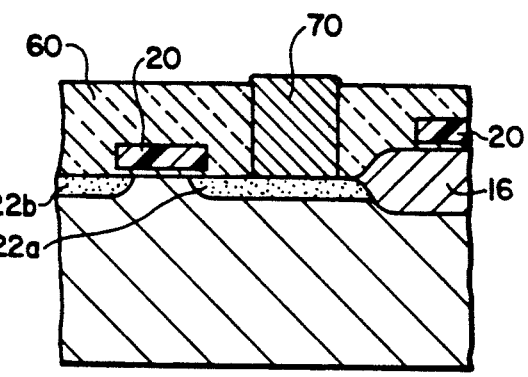

In FIG. 6B, an epitaxial layer 70 is grown up to the surface of the flattened layer 60 using the substrate surface of the exposed source region 22a as a seed.

Figure 6C:
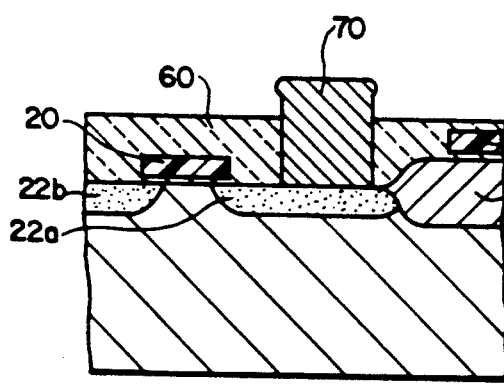

In FIG. 6C, the whole face of the first insulating layer 60 is etched a certain thickness by an etch-back process so that a part of the top of the epitaxial layer 70 is projected in a convex form.

Figure 6D:
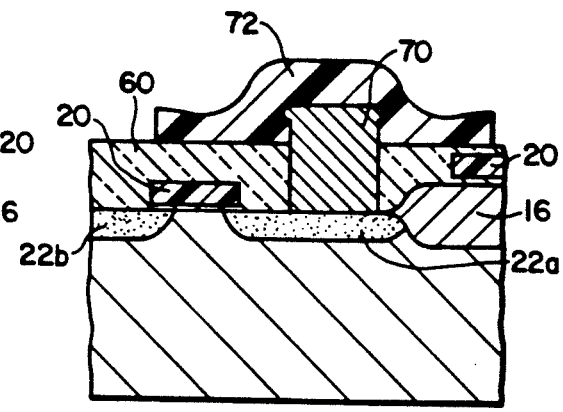

A second conductive layer 72 of a capacitor is formed on the projected epitaxial layer 70 and the first insulating layer 60 and has a pattern as shown in FIG. 6D.

In Examples I to IV described above, it should be understood that an epitaxial layer may be formed using the substrate surface of the exposed drain region 22b as a seed, after the formation of the second contact hole 38 on the drain region.

Further, second conductive layer 30 (i.e. the lower electrode of the capacitor) of FIGS. 3 and 4 can be formed almost simultaneously with the epitaxial layers 28, 52 by lowering the selection ratio during the growing of the epitaxial layers 28, 52 through the first contact hole 26.

According to the present invention as described above, an epitaxial layer is grown at the contact portion to prevent the deposition of defects of the polycrystalline silicon layer to the impurity doped region during the formation of a contact therebetween. Thus, the reliability of the semiconductor device is greatly enhanced while the contact size is reduced.

It is to be understood that the invention is not limited to the disclosed embodiments, but is intended to cover various modifications and equivalent arrangements included within the spirit and scope of the appended claims.

What is claimed is:

1. A semiconductor memory device comprising;
a semiconductor substrate of a first conductivity type;
a plurality of word lines formed by a first conductive layer;
a plurality of bit lines formed by a second conductive layer;
a plurality of memory cells respectively positioned at the intersections of said word lines and said bit lines each of said memory cells having:
a switching transistor having first and second impurity-doped regions of a second conductivity type opposite to said first conductivity type, said regions formed in said substrate and spaced apart through a channel region, said transistor having a gate conductive layer connected to one of said word lines and formed over said channel region through a gate oxide layer interposed therebetween;
a field oxide adjacent to said first impurity-doped region, at least a portion of said field oxide being recessed into said substrate;
a first insulating layer covering said gate conductive layer, said field oxide and said impurity-doped regions, said insulating layer having a hole for exposing a portion on a surface of said first impurity-doped region;
a silicon plug of said second conductivity type selectively formed on said exposed surface through said hole being confined to an area defined by said hole; and
a storage capacitor having a first electrode formed by a third conductive layer, a second electrode formed by a fourth conductive layer and a dielectric layer formed between said first and second electrodes, said third conductive layer made in contact with said plug and extending to overlie at least a portion of said gate conductive layer and said field oxide.

2. A semiconductor memory device as recited in claim 1, further comprising a second gate conductive layer connected to another of said word lines, said second gate conductive layer formed between said field oxide and said first insulating layer and said third conductive layer overlying said second gate conductive layer.

3. A semiconductor memory device as recited in claim 1, wherein said silicon plug is a selectively grown silicon layer.

4. A semiconductor memory device as recited in claim 1, wherein said silicon plug is selectively formed extending over a surface of said first insulating layer through said hole.

5. A semiconductor memory device including an array of memory cells, said device comprising:
a semiconductor substrate of a first conductivity type;
a field oxide formed on said substrate defining said array of memory cells;
each memory cell having:
a gate electrode spaced apart from said substrate through a gate insulating layer;
a pair of spaced impurity-doped regions of a second conductivity type opposite to said first conductivity type, said regions being disposed in said substrate and adjacent to said gate electrode;
a first insulating layer covering said gate electrode;
a silicon plug of said second conductivity type formed on said substrate contacting one of said impurity-doped regions confined to an area defined by said first insulating layer; and a storage capacitor having a first electrode contacting said silicon plug and extending over and spaced from said gate electrode and over a portion of said field oxide, a dielectric layer covering said first electrode, and a second electrode covering said dielectric layer.

6. A semiconductor device as recited in claim 5, wherein said silicon plug is a selective epitaxial grown layer of a silicon.

* * * * *